United States Patent
Wada

(10) Patent No.: US 9,240,455 B2
(45) Date of Patent: Jan. 19, 2016

(54) SILICON CARBIDE SEMICONDUCTOR DEVICE AND METHOD FOR MANUFACTURING THE SAME

(71) Applicant: Sumitomo Electric Industries, Ltd., Osaka-shi (JP)

(72) Inventor: Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/638,417

(22) Filed: Mar. 4, 2015

(65) Prior Publication Data

US 2015/0295059 A1 Oct. 15, 2015

(30) Foreign Application Priority Data

Apr. 10, 2014 (JP) ................ 2014-081116

(51) Int. Cl.
| | |
|---|---|
| *H01L 29/15* | (2006.01) |
| *H01L 29/49* | (2006.01) |
| *H01L 29/16* | (2006.01) |
| *H01L 29/78* | (2006.01) |
| *H01L 29/66* | (2006.01) |
| *H01L 21/04* | (2006.01) |

(52) U.S. Cl.
CPC .............. *H01L 29/49* (2013.01); *H01L 21/049* (2013.01); *H01L 21/0485* (2013.01); *H01L 29/1608* (2013.01); *H01L 29/66681* (2013.01); *H01L 29/7816* (2013.01)

(58) Field of Classification Search
None
See application file for complete search history.

(56) References Cited

U.S. PATENT DOCUMENTS

| | | | |
|---|---|---|---|
| 2004/0087093 A1 | 5/2004 | Fukuda et al. | |
| 2006/0006458 A1* | 1/2006 | Motai ................. | H01L 29/0634 257/330 |
| 2015/0236148 A1* | 8/2015 | Masuda ................ | H01L 2/7813 257/77 |

FOREIGN PATENT DOCUMENTS

JP 2002-222943 A 8/2002

* cited by examiner

*Primary Examiner* — Jack Chen
(74) *Attorney, Agent, or Firm* — Venable LLP; Michael A. Sartori; Tamatane J. Aga

(57) ABSTRACT

A MOSFET includes an SiC layer including main surfaces. The SiC layer includes an n type drift region, a p type body region, and an n type source region. The MOSFET further includes a gate insulating film formed to be located on a channel region, a gate electrode formed to be located above the channel region, the gate insulating film being sandwiched between said gate electrode and said channel region, and a connection electrode which includes a contact portion having a width smaller than a width of the gate electrode, has electric resistance lower than electric resistance of the gate electrode, and is formed on the gate electrode.

10 Claims, 12 Drawing Sheets

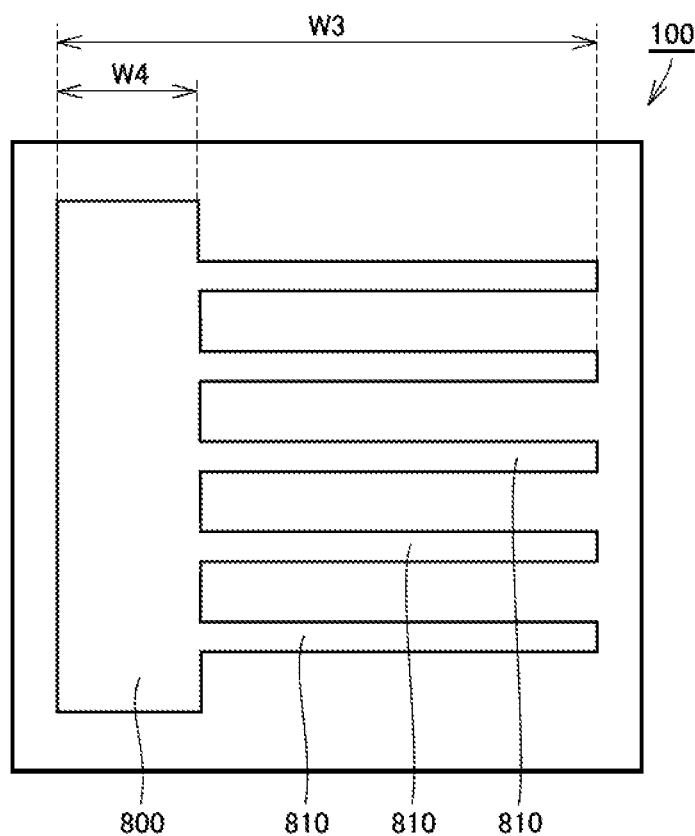

SILICON CARBIDE SEMICONDUCTOR DEVICE AND METHOD FOR MANUFACTURING THE SAME

BACKGROUND OF THE INVENTION

1. Field of the Invention

The present invention relates to a silicon carbide semiconductor device and a method for manufacturing the same.

2. Description of the Background Art

An exemplary semiconductor device adopting silicon carbide as its material is described in Japanese Patent Laying-Open No. 2002-222943.

SUMMARY OF THE INVENTION

A silicon carbide semiconductor device according to the present invention includes a silicon carbide layer including one main surface and another main surface opposite to the one main surface. The silicon carbide layer includes a drift region which includes the other main surface and has a first conductivity type, a body region which is formed on the drift region and has a second conductivity type, and a source region which includes the one main surface, is formed to sandwich the body region between the source region and the drill region, and has the first conductivity type. The silicon carbide semiconductor device further includes agate insulating film formed to be located on a channel region which is sandwiched between the drift region and the source region in the body region, the channel region including the one main surface, a gate electrode formed to be located above the channel region, the gate insulating film being sandwiched between the gate electrode and the channel region, and a connection electrode which includes a portion having a width smaller than a width of the gate electrode, has electric resistance lower than electric resistance of the gate electrode, and is formed on the gate electrode.

A method for manufacturing a silicon carbide semiconductor device according to the present invention includes the step of forming a silicon carbide layer including one main surface and another main surface opposite to the one main surface. In the step of forming the silicon carbide layer, a drill region, a body region, and a source region are formed, the drift region including the other main surface and having a first conductivity type, the body region being located on the drift region and having a second conductivity type, and the source region including the one main surface, being located to sandwich the body region between the source region and the drift region, and having the first conductivity type. The method for manufacturing the silicon carbide semiconductor device further includes the steps of forming a gate insulating film located on a channel region which is sandwiched between the drift region and the source region in the body region, the channel region including the one main surface, forming a gate electrode located above the channel region, the gate insulating film being sandwiched between the gate electrode and the channel region, forming an ohmic electrode on and in contact with the source region, and forming a connection electrode having electric resistance lower than electric resistance of the gate electrode, on the gate electrode, after the step of forming the ohmic electrode.

The other objects, features, aspects and advantages of the present invention will become more apparent from the following detailed description of the present invention when taken in conjunction with the accompanying drawings.

BRIEF DESCRIPTION OF THE DRAWINGS

FIG. 17 is a schematic plan view showing a structure of a MOSFET in a comparative example.

DETAILED DESCRIPTION OF THE INVENTION

Figure 1:
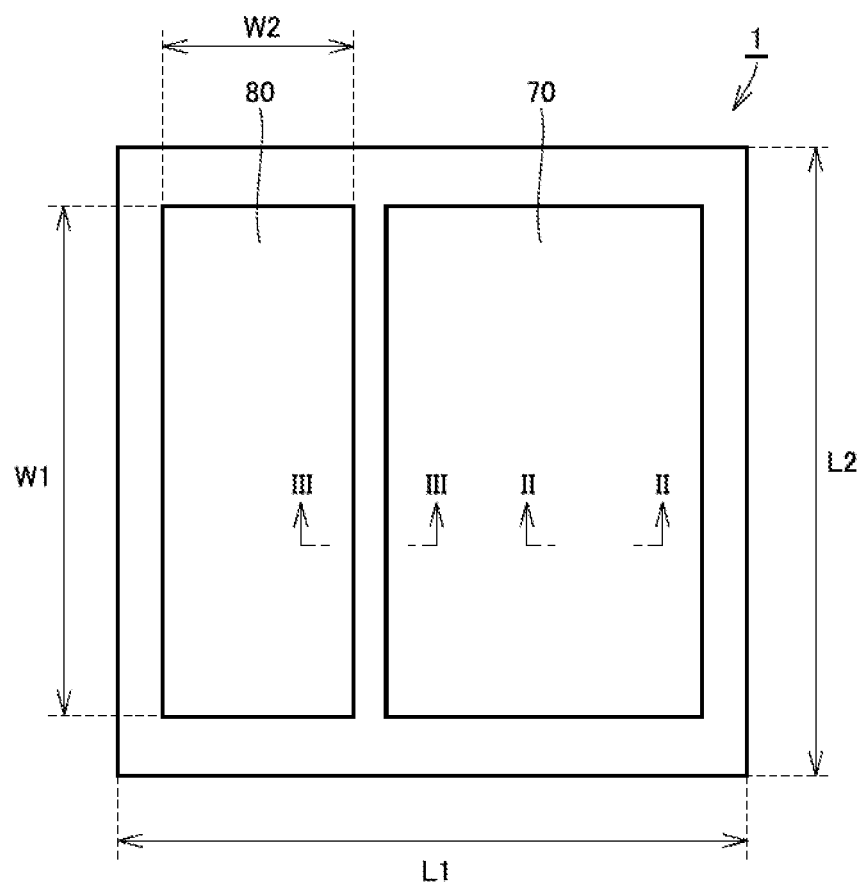
FIG. 1 is a plan view schematically showing a structure of a silicon carbide semiconductor device in accordance with Embodiment 1 of the present invention.

Description of Embodiments of the Invention of the Present Application

First, contents of embodiments of the present invention will be described in list form.

(1) A silicon carbide semiconductor device (MOSFET t) in accordance with the present embodiment includes a silicon carbide layer (SiC layer 11) including one main surface 11A and another main surface 11B opposite to main surface 11A. SiC layer 11 includes a drift region 12 which includes main surface 11B and has a first conductivity type (n type), a body region 13 which is formed on drill region 12 and has a second conductivity type (p type), and a source region 14 which includes main surface 11A, is formed to sandwich body region 13 between source region 14 and drift region 12, and has the first conductivity type MOSFET 1 further includes a gate insulating film 20 formed to be located on a channel region CH which is sandwiched between drift region 12 and source region 14 in body region 13, channel region CH including main surface 11A, a gate electrode 30 formed to be located above channel region CH, gate insulating film 20 being sandwiched between gate electrode 30 and channel region CH, and a connection electrode 31 which includes a portion (contact portion 32) having a width smaller than a width of gate electrode 30, has electric resistance lower than electric resistance of gate electrode 30, and is formed on gate electrode 30.

In MOSFET 1 described above, gate insulating film 20 and gate electrode 30 are formed on channel region CH, and connection electrode 31 having electric resistance lower than electric resistance of gate electrode 30 is formed on gate electronic 30. Thereby, even when a material having high electric resistance, such as p type polysilicon, is used as a material for gate electrode 30 in order to suppress a reduction in threshold voltage, an increase in the electric resistance of the entire electrodes which contribute to whether or not to form an inversion layer in channel region CH (i.e., gate electrode 30 and connection electrode 31) can be suppressed. As a result, fast switching properties of MOSFET 1 can be ensured. Further, by providing a portion of connection electrode 31 which is in contact with gate electrode 30 to have a width smaller than a width of gate electrode 30, connection electrode 31 can be reliably formed on gate electrode 30 even when an error occurs in the position of forming connection electrode 31. Accordingly, the possibility of a short circuit between connection electrode 31 and a source electrode 50 can be reduced, source electrode 50 being arranged with a lower layer interlayer insulating film 40 sandwiched between connection electrode 31 and source electrode 50. Thus, MOSFET 1 described above is a silicon carbide semiconductor device having improved switching properties and excellent electrical characteristics.

(2) MOSFET 1 described above may further include an interlayer insulating film (lower layer interlayer insulating film 40) formed on gate insulating film 20. Further, connection electrode 31 may include contact portion 32 in contact with gate electrode 30, and a wide portion 33 which has a width larger than a width of contact portion 32 and is located on lower layer interlayer insulating film 40.

Thereby, the process for forming a pattern of connection electrode 31 (for example, photolithography or the like) can be performed more easily, when compared with a case where wide portion 33 is not formed.

(3) in MOSFET 1 described above in (2), connection electrode 31 may include a barrier layer 31A in contact with lower layer interlayer insulating film 40.

Thus, a reaction between connection electrode 31 and lower layer interlayer insulating film 40 can be suppressed by form barrier layer 31A at the contact portion with lower layer interlayer insulating film 40 in connection electrode 31, and using a material having a low reactivity with lower layer interlayer insulating film 40 as a material for barrier layer 31A. Here, "barrier layer 31A" is a layer containing a material having a relatively low reactivity with lower layer interlayer insulating film 40 when compared with other portions of connection electrode 31, and is preferably a layer made of the material described above. Thereby, when connection electrode 31 contains aluminum or the like, entrance of the aluminum into the inside of lower layer interlayer insulating film 40 and an increase in the leak current between connection electrode 31 and source electrode 50 can be suppressed.

(4) MOSFET 1 described above in (1) may further include an interlayer insulating film (lower layer interlayer insulating film 40) formed on gate insulating film 20. Further, connection electrode 31 may include barrier layer 31. A in contact with lower layer interlayer insulating film 40.

Thereby, a reaction between connection electrode 31 and lower layer interlayer insulating film 40 can be suppressed by using a material having a low reactivity with lower layer interlayer insulating film 40 as a material for barrier layer 31A, as in the case of (3) described above. Specifically, when connection electrode 31 contains aluminum or the like, entrance of the aluminum into the inside of lower layer interlayer insulating film 40 and an increase in the leak current between connection electrode 31 and source electrode 50 can be suppressed.

(5) In MOSFET 1 described above, barrier layer 31A may contain titanium nitride.

Thereby, the reaction between connection electrode 31 including barrier layer 31A and lower layer interlayer insulating film 40 can be suppressed more effectively. As a result, entrance of aluminum which may be contained in connection electrode 31 into the inside of lower layer interlayer insulating film 40 and an increase in the leak current between connection electrode 31 and source electrode 50 can be suppressed more effectively.

(6) In MOSFET 1 described above, gate electrode 30 may contain polysilicon having p type conductivity.

By adopting p type polysilicon having a work function larger than n type polysilicon as a material for gate electrode 30 as described above, switching properties can be improved while suppressing a reduction in the threshold voltage of MOSFET 1.

(7) MOSFET 1 described above, connection electrode 31 may contain at least one metal selected from the group consisting of an aluminum alloy, aluminum, titanium, titanium nitride, tungsten, molybdenum, nickel, gold, and copper.

Thereby, the electric resistance of connection electrode 31 can be further reduced. As a result, switching properties of MOSFET 1 can be further improved.

(8) In MOSFET 1 described above the aluminum alloy may be an aluminum alloy (AlSi) which contains silicon as an alloy element, or an aluminum alloy (AlSiCu) which contains silicon and copper as alloy elements.

Thus, in MOSFET 1 described above, AlSi, AlSiCu or the like which is a typical aluminum alloy can be adopted. Thereby, the electric resistance of connection electrode 31 can be reduced and switching properties of MOSFET 1 can be further improved.

(9) MOSFET 1 described above may have a peripheral shape of a quadrangle in which at least one side has a length L1, L2 of more than or equal to 2 min when main surface 11A of SiC layer 11 is viewed in a plan view. In addition, MOSFET 1 described above may further include a gate pad electrode 80 directly connected with connection electrode 31.

Since connection electrode 31 having electric resistance lower than electric resistance of gate electrode 30 is formed in MOSFET 1 described above, connection electrode 31 can be directly connected to gate pad electrode 80 without providing a gate runner. Thereby, the device structure of MOSFET 1 can be further simplified. This is particularly effective in a case where MOSFET 1 has a large chip size (for example, in a case where MOSFET 1 is a chip of a size in which at least one side based length of more than or equal to 2 mm).

(10) In MOSFET 1 described above, the ratio of a maximum width W1 to a minimum width W2 of gate pad electrode 80 may be more than or equal to 2 and less than or equal to 3.

Since there is no need to provide agate runner so as to protrude from gate pad electrode 80 in MOSFET 1 described above, the ratio between the widths of gate pad electrode 80 (the ratio of maximum width W1 to minimum width W2) can be set to die range described above. Here, the "maximum width" is the maximum value of a distance between two opposite sides in gate pad electrode 80, and the "minimum width" is the minimum value of the distance between two opposite sides in gate pad electrode 80.

(11) A method for manufacturing a silicon carbide semiconductor device in accordance with the present embodiment includes the step of forming a silicon carbide layer (SiC layer 11) including one main surface 11A and another main surface 11B opposite to main surface 11A in the step of forming SiC layer 11, drift region 12, body region 13, and source region 14 are formed, drift region 12 including main surface 11B and having the first conductivity type (n type), body region 13 being located on drift region 12 and having the second conductivity type (p type), and source region 14 including main surface 11A, being located to sandwich body region 13 between source region 14 and drift region 12, and having the first conductivity type. The method for manufacturing, the silicon carbide semiconductor device further includes the steps of forming gate insulating film 20 located on channel region CH which is sandwiched between drift region 12 and source region 14 in body region 13, channel region CH including main surface 11A, forming gate electrode 30 located above channel region CH, gate insulating film 20 being sandwiched between gate electrode 30 and channel region CH, forming an ohmic electrode (source electrode 50) on and in contact with source region 14, and forming connection electrode 31 having electric resistance lower than electrical resistance of gate electrode 30, on gate electrode 30, after the step of forming the ohmic electrode.

In the method for manufacturing the silicon carbide semiconductor described above, gate insulating film 20 and gate electrode 30 are formed on channel region CH, and connection electrode 31 having electric resistance lower than electric resistance of gate electrode 30 is formed on gate electrode 30. Thereby, even when gate electrode 30 made of a material having high electric resistance, such as p type polysilicon is formed in order to suppress a reduction in threshold voltage, an increase in the electric resistance of the entire electrodes which contribute to whether or not to thrill an inversion layer in channel region CH (i.e., gate electrode 30 and connection electrode 31) can be suppressed. As a result, MOSFET 1 for which fast switching properties are ensured can be manufactured. Further, the step of forming connection electrode 31 is performed after the step of forming the ohmic electrode including annealing treatment at high temperature. Thus, the material for connection electrode 31 can be selected from the viewpoint of reducing resistance, without considering the relation between the temperature of the above annealing treatment and the melting point of a metal, and the like. Therefore, according to the method for manufacturing the silicon carbide semiconductor device in accordance with the present embodiment, a silicon carbide semiconductor device having improved switching properties and excellent electrical characteristics can be manufactured.

(12) in the method for manufacturing the silicon carbide semiconductor device described above, connection electrode 31 may include a portion (contact portion 32) having a width smaller than a width of gate electrode 30.

Thereby, connection electrode 31 can be reliably formed on gate electrode 30 even when an error occurs in the position of forming connection electrode 31. As a result, the possibility of a short circuit between connection electrode 31 and source electrode 50 can be reduced, source electrode 50 being formed with lower layer interlayer insulating film 40 sandwiched between connection electrode 31 and source electrode 50.

(13) The method for manufacturing the silicon carbide semiconductor device described above may further include the step of forming an interlayer insulating film (lower layer interlayer insulating film 40) which surrounds gate electrode 30 together with gate insulating film 20, on gate insulating film 20, after the step of forming the gate electrode and before the step of forming the ohmic electrode. Further, in the step of forming connection electrode 31, connection electrode 31 may be thrilled which has contact portion 32 in contact with gate electrode 30 and wide portion 33 having a width larger than a width of contact portion 32, wide portion 33 being located on lower layer interlayer insulating film 40.

Thereby, the pattern of connection electrode 31 can be formed more easily, when compared with the case where wide portion 33 is not formed. As a result, the efficiency of the process for manufacturing MOSFET 1 can be improved.

(14) in the method for manufacturing the silicon carbide semiconductor device described above in (13), in the step of forming the connection electrode, connection electrode 31 including barrier layer 31A in contact with the interlayer insulating film (lower layer interlayer insulating film 40) may be formed.

Thus, MOSFET with suppressed reaction between connection electrode 31 and lower layer interlayer insulating film 40 can be manufactured by forming connection electrode 31 including barrier layer 31A at the contact portion with lower layer interlayer insulating film 40, and using a material having a low reactivity with lower layer interlayer insulating film 40 as a material for barrier layer 31A. Thereby, when connection electrode 31 contains aluminum or the like, entrance of the aluminum into the inside of lower layer interlayer insulating film 40 and an increase in the leak current between connection electrode 31 and source electrode 50 can be suppressed.

(15) The method for manufacturing the silicon carbide semiconductor device described above in (11) or 12) may further include the step of forming an interlayer insulating film (lower layer interlayer insulating film 40) which surrounds gate electrode 30 together with gate insulating film 20, on gate insulating filling 20, after the step of forming gate electrode 30 and before the step of forming the ohmic electrode (source electrode 50). Further, in the step of forming connection electrode 31, connection electrode 31 including barrier layer 31A in contact with lower layer interlayer insulating film 40 may be formed.

Thereby, MOSFET 1 with suppressed reaction between connection electrode 31 and lower layer interlayer insulating film 40 can be manufactured by using a material having a low reactivity with lower layer interlayer insulating film 40 as a material for barrier layer 31A, as in the case of (14) described above. Specifically, when connection electrode 31 contains aluminum or the like, entrance of the aluminum into the inside of lower layer interlayer insulating film 40 and an increase in the leak current between connection electrode 31 and source electrode 50 can be suppressed.

(16) In the method for manufacturing the silicon carbide semiconductor device described above, barrier layer 31A may contain titanium nitride.

Thereby, MOSFET 1 in which the reaction between connection electrode 31 including barrier layer 31A and lower layer interlayer insulating film 40 is suppressed more effectively can be manufactured. As a result, entrance of aluminum which may be contained in connection electrode 31 into the inside of lower layer interlayer insulating film 40 and an increase in the leak current between connection electrode 31 and source electrode 50 can be suppressed more effectively.

(17) in the method for manufacturing the silicon carbide semiconductor device described above, gate electrode 30 may contain polysilicon having p type conductivity.

Thereby, MOSFET 1 in which a reduction in threshold voltage is suppressed more effectively when compared with a case where gate electrode 30 is made of n type polysilicon can be manufactured.

(18) In the method for manufacturing the silicon carbide semiconductor device described above, connection electrode 31 may contain at least one metal selected from the group consisting of an aluminum alloy, aluminum, titanium, titanium nitride, tungsten, molybdenum, nickel, gold, and copper.

Thereby, MOSFET 1 in which the electric resistance of connection electrode 31 is further reduced and switching properties are further improved can be manufactured.

(19) In the method for manufacturing the silicon carbide semiconductor device described above, the aluminum alloy may be an aluminum alloy which contains silicon as an alloy element, or an aluminum alloy which contains silicon and copper as alloy elements.

Thus, in the method for a manufacturing the silicon carbide semiconductor device described above, AlSi, AlSiCu, or the like which is a typical aluminum alloy can be adopted. Thereby, MOSFET 1 in which the electric resistance of connection electrode 31 is reduced and switching properties are further improved can be manufactured.

(20) In the method for manufacturing the silicon carbide semiconductor device described above, in the step of forming connection electrode 31, connection electrode 31 is annealed at a temperature of less than or equal to 1000° C. (for example, 400° C. or 300° C.)

The annealing temperature for connection electrode 31 can be set as appropriate in a temperature range lower than the annealing temperature in the step of forming the ohmic electrode described above (less than or equal to 1000° C.).

Details of Embodiments of the Invention of the Present Application

Next, specific examples of the embodiments of the present invention will be described with reference to the drawings. It is noted that, in the drawings described below, the same or corresponding portions are given the same reference characters and are not described repeatedly. Further, in the present specification, an individual plane is represented by ( ) and a group plane is represented by { }. In addition, a negative index is supposed to be crystal/graphically indicated by putting "-" (bar) above a numeral, but is indicated by putting the negative sign before the numeral in the present specification.

Embodiment 1

Figure 2:
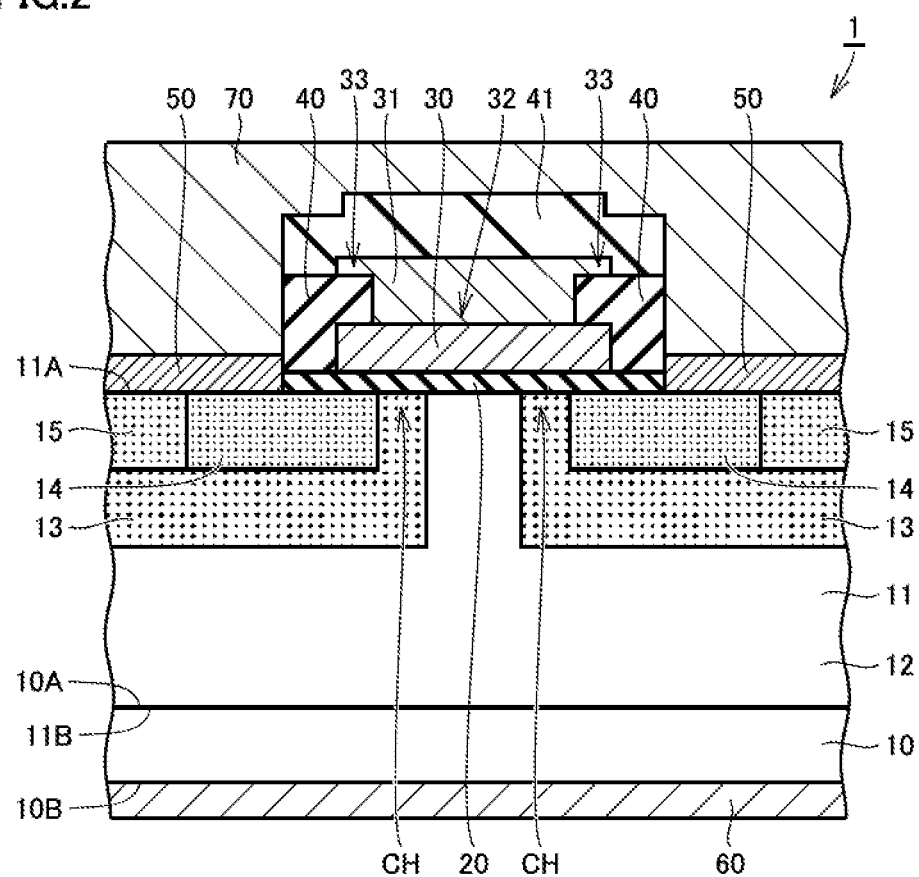
FIG. 2 is a schematic view showing a cross sectional structure along a line segment II-II in FIG. 1.
Figure 3:
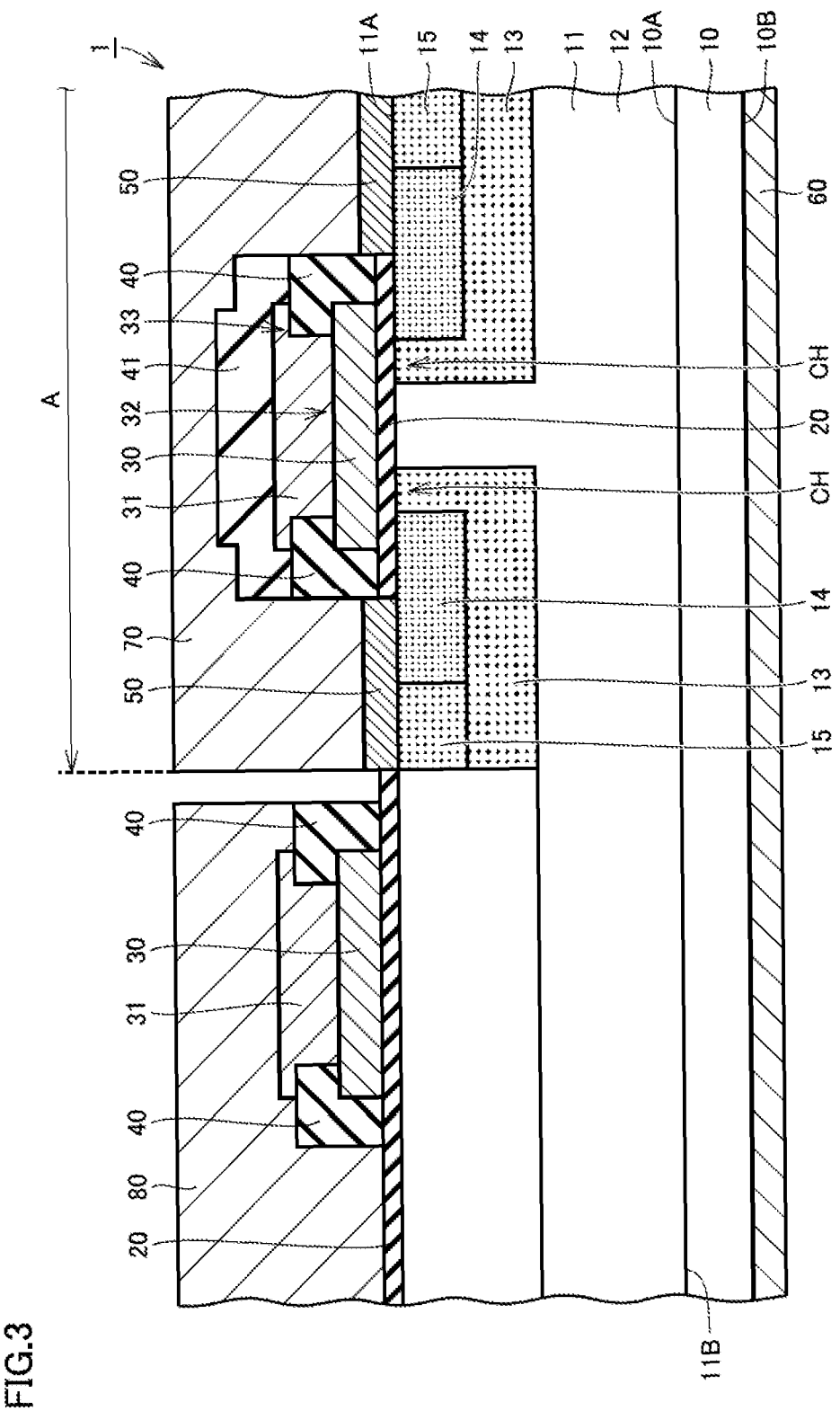
FIG. 3 is a schematic view showing a cross sectional structure along a line segment III-III in FIG. 1.

First, a structure of a silicon carbide semiconductor device (MOSFET 1) in accordance with Embodiment 1 as one embodiment of the present invention will be described. FIG. 1 shows a planar structure of MOSFET 1. FIG. 2 shows a cross sectional structure of MOSFET 1 along a line segment II-II in FIG. 1. FIG. 3 shows a cross sectional structure of MOSFET 1 along a line segment III-III in FIG. 1.

Referring to FIGS. 1 and 2, MOSFET 1 mainly includes a silicon carbide (SiC) substrate 10, SiC layer 11, gate insulating film 20, gate electrode 30, connection electrode 31, lower layer interlayer insulating film 40, an upper layer interlayer insulating film 41, source electrode 50 and a drain electrode 60 (ohmic electrodes), and a source wire 70. In SiC layer 11, drift region 12, body region 13, source region 14, and a contact region 15 are formed.

Referring to FIG. 1, MOSFET 1 has a peripheral shape of a quadrangle in which one side has length L1, L2 of more than or equal to 2 mm when main, surface 11A (FIG. 2) of SiC layer 11 is viewed in a plan view. It is noted that one or both of lengths L1, L2 may be more than or equal to 2 mm. In addition, the peripheral shape of MOSFET 1 may be a square as shown in FIG. 1, or a rectangle.

Referring to FIG. 2, SiC substrate 10 includes one main surface 10A and another main surface 10B opposite to main surface 10A. Main surface 10A, 10B may be a {0001} plane, or a plane having a predetermined off angle for example, an off angle of less than or equal to 10°) with respect to the {0001} plane. SiC substrate 10 contains an n type impurity such as nitrogen (N), for example, and thus has n type conductivity (the first conductivity type).

SiC layer 11 includes one main surface 11A and the other main surface 11B opposite to main surface 11A, and is firmed on main surface 10A of SiC substrate 10 by epitaxial growth. Main surface 11A may be a {0001} plane, or a plane having a predetermined off angle (for example, an off angle of less than or equal to 10°) with respect to the {0001} plane. More specifically, main snake 11A may be a (0001) plane or a plane having the above off angle with respect to the (0001) plane, or a (000-1) plane or a plane having the above off angle with respect to the (000-1) plane. The plane orientation of main surface 11A is not particularly limited.

Drift region 12 is formed to include a portion of main surface 11A and main surface 11B. Drift region 12 contains an n type impurity such as nitrogen (N), for example, and thus has n type conductivity. The n type impurity concentration in drift region 12 is lower than the n type impurity concentration in SIC substrate 10.

Body region 13 is formed on a side of drift region 12 opposite to SiC substrate 10. A plurality of body regions 13 are formed to be spaced from each other in SiC layer 11 to include portions of main surface 11A. Body region 13 contains a p type impurity such as aluminum (Al) or boron (B), for example, and thus has p type conductivity (the second conductivity type).

Source regions 14 are each formed in body region 13 to include a portion of main surface 11A. Source region 14 is formed to sandwich body region 13 between source region 14 and drift region 12, as shown in FIG. 2. A region which is sandwiched between drift region 12 and source region 14 in body region 13 and includes main surface 11A serves as channel region CH. Channel region CH is a region in which an inversion layer is formed by applying a gate voltage when MOSFET 1 operates. Source region 14 contains an n type impurity such as phosphorus (P), for example, and thus has n type conductivity. The n type impurity concentration in source region 14 is higher than the n type impurity concentration in drift region 12.

Contact regions 15 are each formed in body region 13 to include a portion of main surface HA and to be adjacent to source region 14. Contact region 15 contains a p type impurity such as Al or boron B, for example, and thus has p type conductivity. The p type impurity concentration in contact region 15 is higher than the p type impurity concentration in body region 13.

Gate insulating film 20 is made of an insulator such as silicon dioxide ($SiO_2$), for example, and is formed on main surface 11A to extend from above one source region 14 to above another source region 14. Thereby, gate insulating film 20 is formed to be located on channel regions CH of body regions 13.

Gate electrode 30 is formed to be located above channel regions CH. Gate insulating film 20 is sandwiched between gate electrode 30 and channel regions CH. Gate electrode 30 contains polysilicon having p type conductivity obtained by containing a p type impurity such as B, for example, as a material having a large work function ($\phi_m$) and is preferably made of polysilicon having p type conductivity.

Source electrode 50 is formed on main surface 11A to be in contact with source region 14 and contact region 15. Source electrode 50 is made of a material which forms ohmic contact with source region 14 and contact region 15, for example, at least one material selected from the group consisting of $Ni_xSi_y$ (nickel silicon), $Ti_xSi_y$ (titanium silicon), $Al_xSi_y$ (aluminum silicon), and $Ti_xAl_ySi_x$ (titanium aluminum silicon) (x, y, z>0).

Drain electrode 60 is formed on main surface 10B of SiC substrate 10. Drain electrode 60 is made of, for example, the same material as that for source electrode 50, and forms ohmic contact with SiC substrate 10.

Connection electrode 31 includes contact portion 32 having a width smaller than a width of gate electrode 30, and is formed on gate electrode 30. Connection electrode 31 includes contact portion 32 which is in contact with gate electrode 30 and has a width smaller than a width of gate electrode 30, and wide portion 33 which has a width larger than a width of contact portion 32. More specifically, connection electrode 31 has a shape deformed to be in contact with gate electrode 30 and to have a larger width at a portion away from gate electrode 30 by a fixed distance in a thickness direction. Further, connection electrode 31 is formed such that wide portion 33 is located on an upper surface of lower layer interlayer insulating film 40, as shown in FIG. 2.

Connection electrode 31 contains at least one metal selected from the group consisting of an aluminum alloy, Al, Ti, W, Mo, Ni, Au, and Cu, for example, and is preferably made of one metal selected from the above group. The above aluminum alloy may include either one or both of AlSi and AlSiCu. Since connection electrode 31 is made of the metal material described above, connection electrode 31 has electric resistance (sheet resistance) lower than electric resistance of gate electrode 30.

Lower layer interlayer insulating film 40 and upper layer interlayer insulating film 41 are formed to surround gate electrode 30 and connection electrode 31 on gate insulating film 20. Thereby, gate electrode 30 and connection electrode 31 are electrically insulated from source electrodes 50 and force wire 70. Lower layer interlayer insulating film 40 and upper layer interlayer insulating film 41 are made of an insulator such as $SiO_2$, for example.

Source wire 70 is formed to cover source electrodes 50 and upper layer interlayer insulating film 41. Source wire 70 is made of a conductor such as Al, for example, and is electrically connected with source regions 14. Source electrodes 50 is interposed between source wire 70 and source region 14.

Referring to FIGS. 1 and 3, MOSFET 1 further includes gate pad electrode 80 made of a conductor such as Al. Referring to FIG. 3, gate pad electrode 80 is formed in a region away from an element region A including channel regions CH and the like, and is directly connected to connection electrode 31. Thereby, gate pad electrode 80 is electrically connected with gate electrode 30. Connection electrode 31 is interposed between gate pad electrode 80 and gate electrode 30. Referring to FIG. 1, gate pad electrode 80 has a rectangular shape when viewed in a plan view, and the ratio of width W1 (maximum width) to width W2 (minimum width) is more than or equal to 2 and less than or equal to 3, and is preferably more than or equal to 2.5 and less than or equal to 3. Further, width W1 is more than or equal to 700 µm and less than or equal to 3000 µm, and width W2 is more than or equal to 300 µm and less than or equal to 1000 µm. In addition, the values of widths W1, W2 are set as appropriate such that the ratio between the widths (W1/W2) is within the range described above.

Next, an operation of MOSFET 1 described above will be described. Referring to FIG. 2, in a state where a voltage applied to gate electrode 30 is less than a threshold voltage, i.e., in an OFF state, even if a voltage is applied to between source electrode 50 and drain electrode 60, a pn junction formed between body region 13 and drift region 12 is reverse-biased. Accordingly, MOSFET 1 is in an non-conductive state. On the other hand, when a voltage more than or equal to the threshold voltage is applied to gate electrode 30, an inversion layer is formed in channel region CH of body region 13. As a result, source region 14 and drift region 12 are electrically connected to each other, whereby a current flows between source electrode 50 and drain electrode 60, in the manner described above, MOSFET 1 operates.

Figure 15:
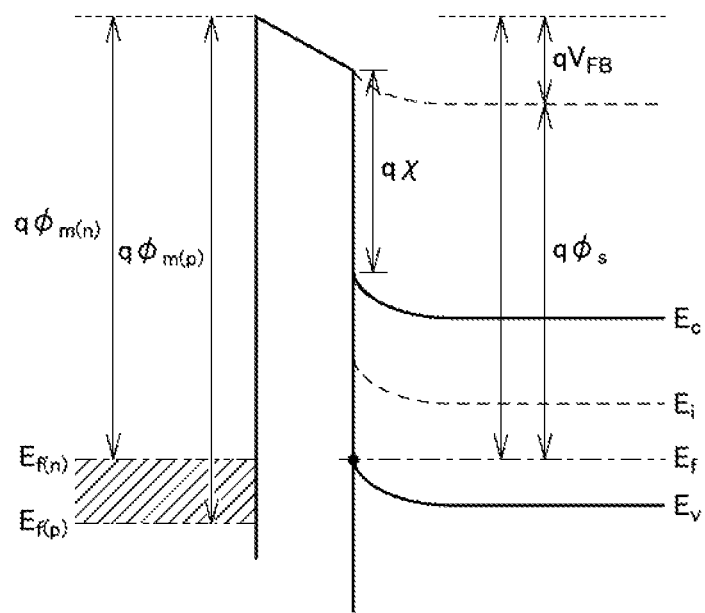
FIG. 15 is a schematic view showing an energy band diagram of polysilicons and silicon carbide.

As described above, in the silicon carbide semiconductor device (MOSFET 1) in accordance with the present embodiment, gate electrode 30 made of p type polysilicon having a work function ($\phi_m$) larger than a work function of n type polysilicon is first formed. Thus, a reduction in the threshold voltage ($V_{th}$) of MOSFET 1 is suppressed. FIG. 15 shows an energy band diagram of polysilicons (p type and n type) and SiC. In FIG. 15, $\phi_{m(n)}$ represents the work function of a type polysilicon, $\phi_{m(p)}$ represents the work function of p type polysilicon, $E_{f(n)}$ represents the Fermi level of n type polysilicon, represents the Fermi level of p type polysilicon, $\phi_s$ represents the work function of SiC, q represents a charge amount, $\chi$ represents electron affinity, $V_{FB}$ represents a flat band potential, $E_C$ represents the energy level at lower end of a conduction band, $E_V$ represents the energy level at an upper end of a valence band, $E_f$ represents the Fermi level of p type SiC, and $E_i$ represents the Fermi level of an intrinsic semiconductor. Moreover, the following expressions (1) and (2) are relational expressions representing the threshold voltage ($V_{th}$) of MOSFET 1 and a voltage change ($V_{Qeff}$) by a fixed charge amount. In expression (1), $C_{OX}$ represents the electrostatic capacitance of an insulating film, $\epsilon_o$ represents the dielectric constant of vacuum, $\epsilon_{SiC}$ represents the dielectric constant of SiC, k represents Boltzmann's constant, represents an absolute temperature, $N_a$ represents an acceptor density, $n_i$ represents the carrier density of the intrinsic semiconductor, q represents a charge amount $\phi_m$ represents the work function of a metal constituting the gate electrode, and $\phi_s$ represents the work function of SiC. In addition, in expression (2), q represents a charge amount, $C_{OX}$ represents the electrostatic capacitance of the insulating film, $Q_{eff}$ represents a fixed charge amount, $d_{ox}$ represents the thickness of the insulating film, $\epsilon_o$ represents the dielectric constant of vacuum, and $\varepsilon_{ox}$ represents the dielectric constant of the insulating film.

$$V_{th} = \frac{2\sqrt{\varepsilon_0 \varepsilon_{SiC} kTN_o \ln(N_a/n_i)}}{C_{OX}} + \frac{2kT}{q}\ln\left(\frac{N_o}{n_i}\right) + (\phi_m - \phi_x) + V_{Qeff} \quad (1)$$

$$V_{Qeff} = -\frac{qQ_{eff}}{C_{OX}} = -qQ_{eff}\frac{d_{ox}}{\varepsilon_0 \varepsilon_{ox}} \quad (2)$$

As shown in FIG. 15, the work function of p type polysilicon is larger than the work function of n type polysilicon. In addition, as indicated in expression (1), the threshold voltage ($V_{th}$) is increased with an increase in the work function ($\phi_m$) of gate electrode 30, and is decreased with an increase in a negative fixed charge ($V_{Qeff}$). Therefore, by using p type polysilicon having a large work function as a material for gate electrode 30 as in MOSFET 1, a reduction in threshold voltage can be suppressed even when the negative fixed charge ($V_{Qeff}$) is increased by the nitriding process (step (S60)).

Figure 16:
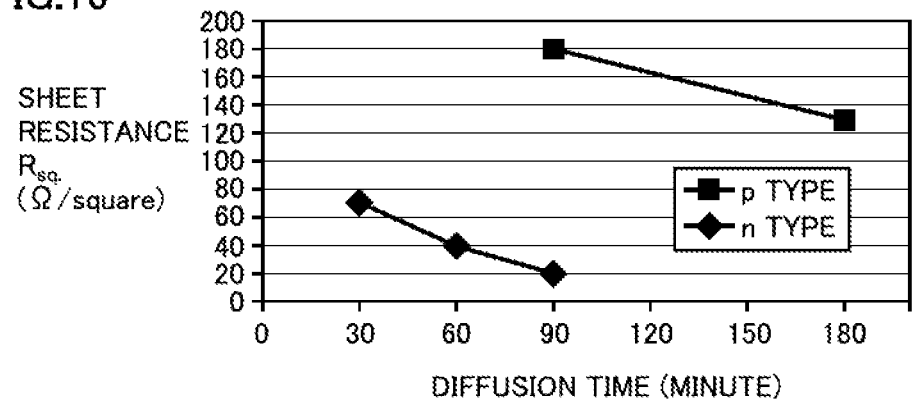
FIG. 16 is a graph showing the relation between annealing time and sheet resistances of polysilicons.

Meanwhile, gate electrode 30 made of p type polysilicon has electric resistance lower than electric resistance of a gate electrode made of n type polysilicon. FIG. 16 is a graph showing the relation between heat treatment time (diffusion time) and sheet resistances of polysilicons, in a case where polysilicons (thickness about 350 nm) are doped with an n type impurity (P) and a p type impurity (B) at a concentration of more than or equal to $1\times10^{19}$ cm$^{-19}$ and less than or equal to $1\times10^{20}$ cm$^{-3}$, and are heat treated at an annealing temperature of 1000° C. In the graph of FIG. 16, the axis of abscissas represents diffusion time (minute) and the axis of ordinate represents sheet resistance (Ω/square). In addition, in the graph of FIG. 16, quadangles represent the data of p type polysilicon, and rhombuses represent the data of n type polysilicon. As shown in FIG. 16, the polysilicon doped with the p type impurity has sheet resistance higher than sheet resistance of the polysilicon doped with the n type impurity.

On the other hand, in MOSFET 1 described above, connection electrode 31 having electric resistance lower than electric resistance of gate electrode 30 is formed on gate electrode 30. Thereby, even when gate electrode 30 made of p type polysilicon is adopted in order to suppress a reduction in threshold voltage, an increase in the electric resistance of the entire electrodes which contribute to whether or not to form an inversion layer in channel region CH (i.e., gate electrode 30 and connection electrode 31) can be suppressed. As a result, fast switching properties of MOSFET 1 can be ensured. Further, by providing a portion of connection electrode 31 which is in contact with gate electrode 30 to have a width smaller than a width of gate electrode 30 connection electrode 31 can be reliably formed on gate electrode 30 even when an error occurs in the position of forming connection electrode 31. Accordingly, the possibility of a short circuit between connection electrode 31 and source electrode 50 can be reduced, source electrode 50 being arranged with lower layer interlayer insulating film 40 sandwiched between connection electrode 31 and source electrode 50. Thus MOSFET 1 described above is a silicon carbide semiconductor device having improved switching properties and excellent electrical characteristics.

Further, a MOSFET 100 in a comparative example shown in FIG. 17 has a structure in which a gate pad electrode 800 includes a plurality of gate runners 810, and gate runners 810 are connected with respective gate electrodes (not shown) in contrast, MOSFET 1 in accordance with the present embodiment described above has a structure in which connection electrode 31 having electric resistance lower than electric resistance of gate electrode 30 is directly connected with gate pad electrode 80 (FIG. 3), and thus gate pad electrode 80 and gate electrode 30 can be electrically connected to each other without providing a gate runner as in the comparative example described above. Therefore, in gate pad electrode 800 in the comparative example, the ratio of a width W3 (maximum width) to a width W4 (minimum width) is more than 3, whereas in the present embodiment, the ratio of width (maximum width) to width W2 (minimum width) of gate pad electrode 80 is more than or equal to 2 and less than or equal to 3.

Next, a method for manufacturing the silicon carbide semiconductor device in accordance, with the present embodiment will be described. In the method for manufacturing the silicon carbide semiconductor device in accordance with the present embodiment, MOSFET 1 serving as the silicon carbide semiconductor device in accordance with the present embodiment is manufactured.

Figure 4:
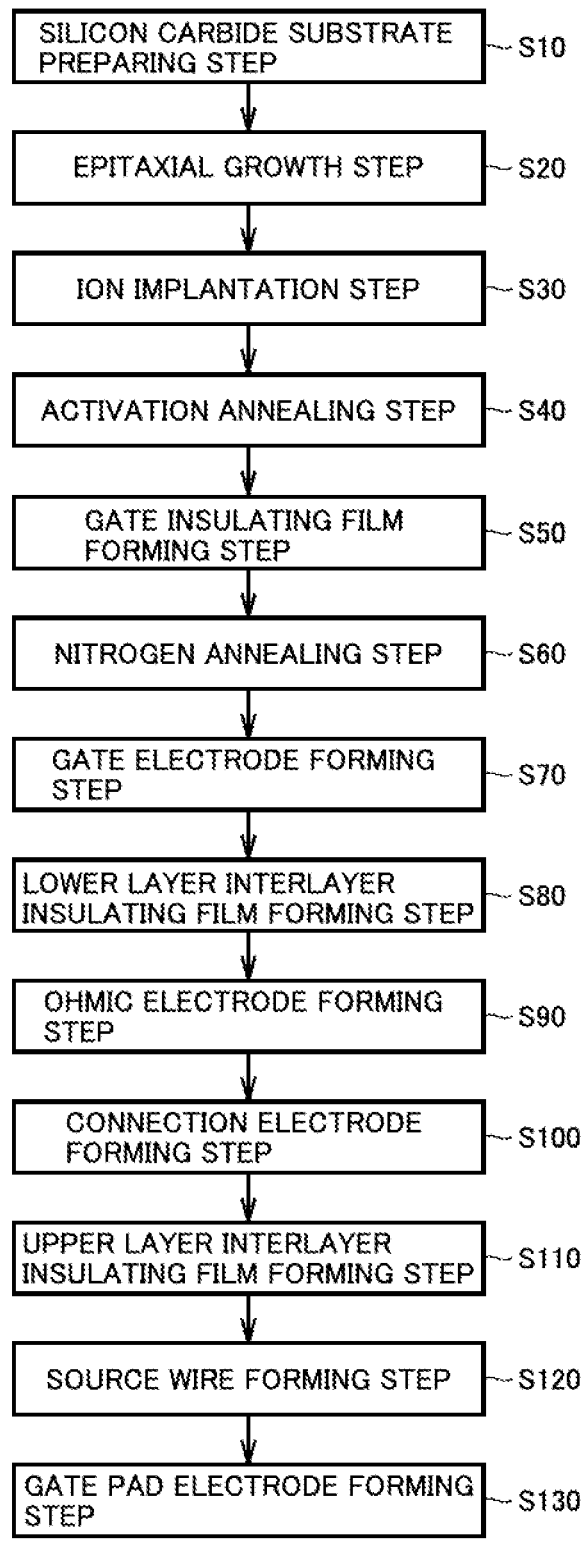
FIG. 4 is a flowchart schematically showing a method for manufacturing the silicon carbide semiconductor device in accordance with Embodiment 1 of the present invention.
Figure 5:
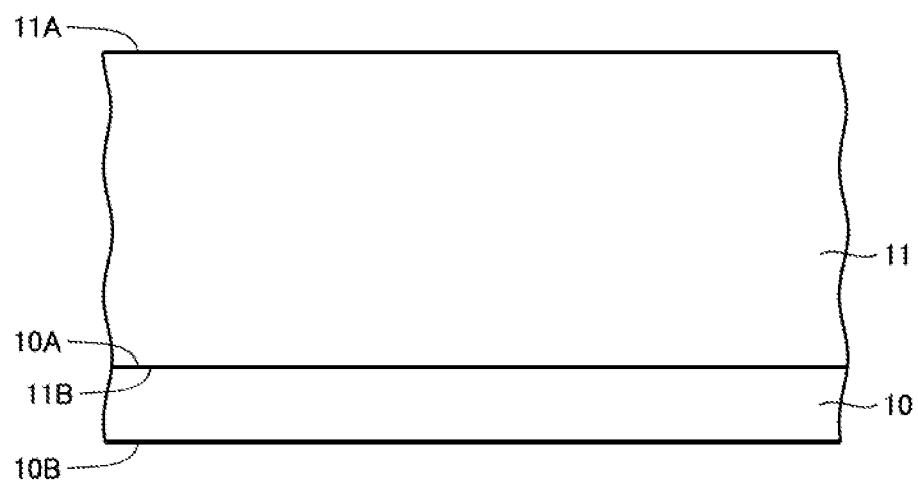
FIG. 5 is a schematic view for illustrating steps (S10) and (S20) of the method for manufacturing the silicon carbide semiconductor device in accordance with Embodiment 1 of the present invention.

Referring to FIG. 4, first, a silicon carbide substrate preparing step is performed as step (S10) in this step (S10), referring to FIG. 5, an ingot (not shown) made of, for example, 4H—SiC is sliced to prepare SiC substrate 10 having main surfaces 10A, 10B.

Next, as step (S20), an epitaxial growth step is performed in this step (S20), referring to FIG. 5, in layer 11 is formed on main surface 10A of SiC substrate 10 by epitaxial growth. Thereby, SiC layer 11 including main surface 11A and main surface 11B opposite to main surface 11A is formed.

Figure 6:
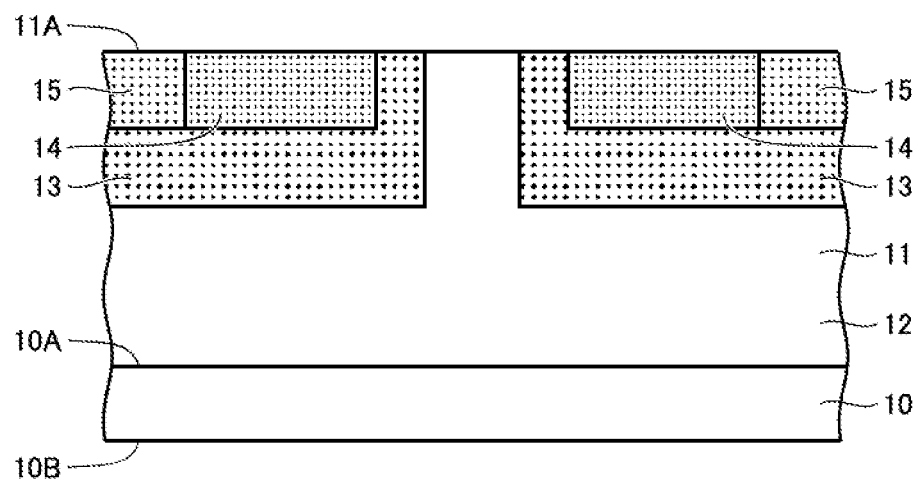
FIG. 6 is a schematic view for illustrating steps (S30) and (S40) of the method for manufacturing the silicon carbide semiconductor device in accordance with Embodiment 1 of the present invention.

Next, as step (S30), an ion implantation step is performed in this step (S30), referring to FIG. 6, first, for example, Al ions are implanted into SiC layer 11 from the main surface 11A side thereby forming body regions 13 in SiC layer 11. Next, for example, P ions are implanted into body regions 13 to a depth shallower than the depth of the above Al ions, thereby forming source regions 14 in body regions 13. Then, for example, Al ions are implanted into body regions 13 to a depth identical to the depth of the above P ions, thereby forming contact regions 15 in body regions 13 to be adjacent to source regions 14. Further, in SiC layer 11, a region in which none of body region 13, source region 14, and contact region 15 is formed serves as drill region 12. In this way, drift region 12 which includes main surface 11B and has n type conductivity, body region 13 which is located on drift region 12 and has p type conductivity, and source region 14 which includes main surface 11A, is located to sandwich body region 13 between source region 14 and drill region 12, and has n type conductivity are formed in SiC layer 11.

Next, as step (S40), an activation annealing step is performed. In this step. (S40), referring to FIG. 6, by heating SiC substrate 10, the impurities introduced into SiC layer 11 in the above step (S30) are activated. Thereby, desired carriers are generated in impurity regions in SIC layer 11.

Figure 7:
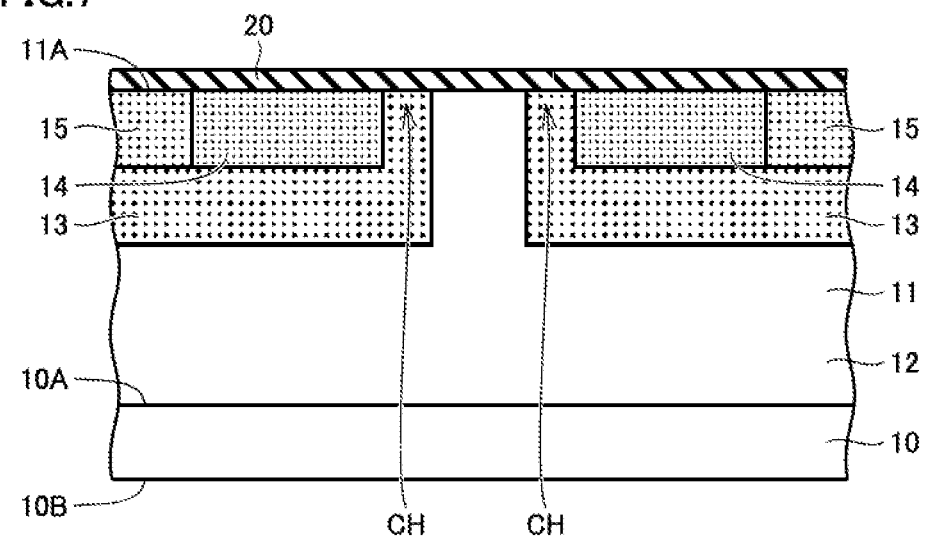
FIG. 7 is a schematic view for illustrating steps (S50) and (S60) of the method for manufacturing the silicon carbide semiconductor device in accordance with Embodiment 1 of the present invention.

Next, as step (S50), a gate insulating film forming step is performed. In this step (S50), referring to FIG. 7, SIC substrate 10 having SiC layer 11 formed thereon is heated in an atmosphere containing oxygen, for example. Thereby, gate insulating film 20 made of $SiO_2$ is formed to be located on channel regions CH, in body regions 13, and to cover entire main surface 11A.

Next, as step (S60), a nitrogen annealing step is performed. In this step (S60), SiC substrate 10 is heated in a gas atmosphere containing nitric oxide (NO), nitrous oxide ($N_2O$), or the like, for example. Thereby, nitrogen atoms are introduced into an interface between SIC layer 11 and gate insulating film 20. As a result, an interface state is terminated with nitrogen, and the channel mobility of MOSFET 1 is improved.

Figure 8:
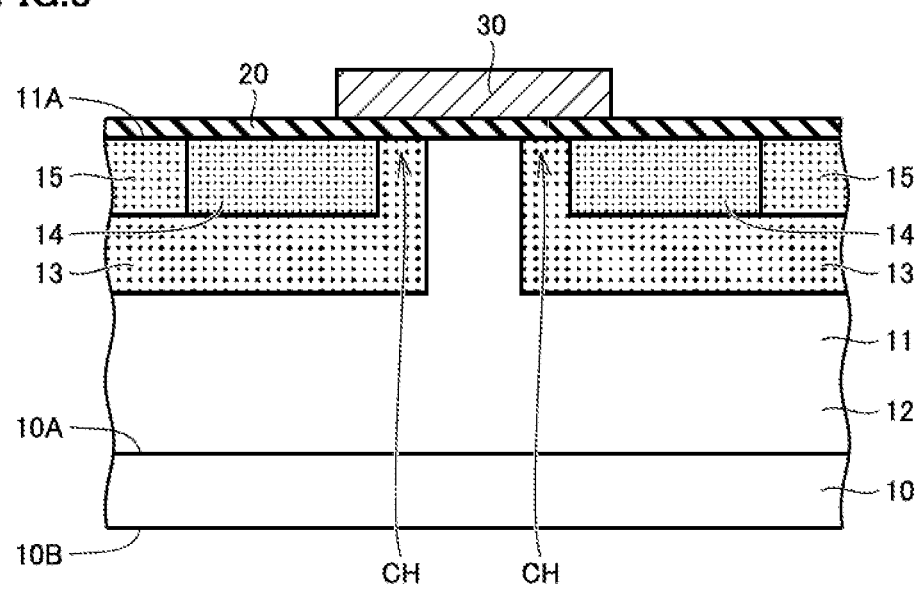
FIG. 8 is a schematic view for illustrating a step (S70) of the method for manufacturing the silicon carbide semiconductor device in accordance with Embodiment 1 of the present invention.

Next, as step (S70), a gate electrode forming step is performed in this step (S70), referring to FIG. 8, gate electrode 30 made of p type polysilicon is formed to be located above channel regions CH. Gate insulating film 20 is sandwiched between gate electrode 30 and channel regions CH, for example by an LPCVD (Low Pressure Chemical Vapor Deposition) method.

Figure 9:
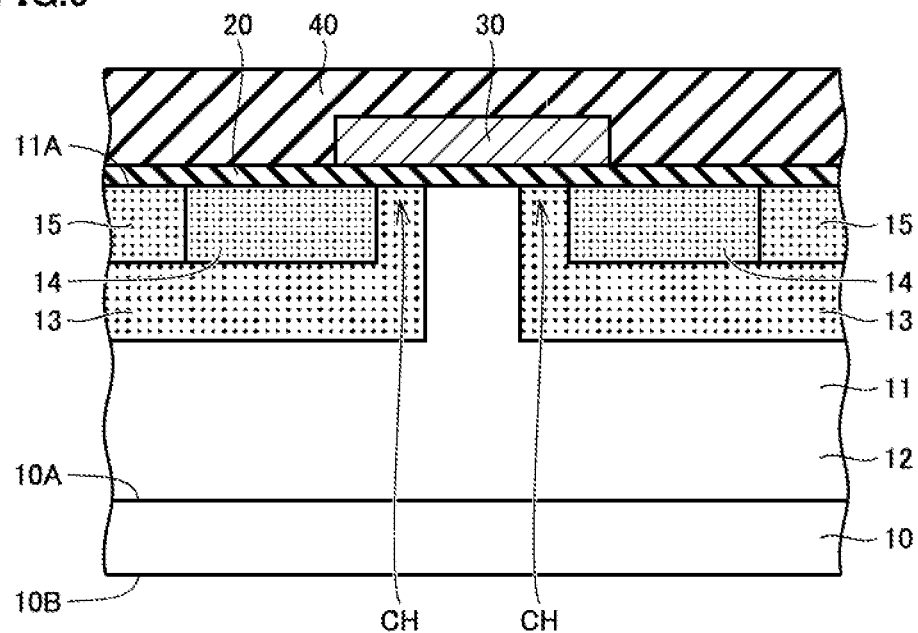
FIG. 9 is a schematic view for illustrating a step (S80) of the method for manufacturing the silicon carbide semiconductor device in accordance with Embodiment 1 of the present invention.

Next, as step (S80), a lower layer interlayer insulating film forming step is performed. In this step (S80), referring to FIG. 9, lower layer interlayer insulating film 40 made of $SiO_2$ is formed on gate insulating film 20 to surround gate electrode 30 together with gate insulating film 20, for example by a CVD method.

Figure 10:
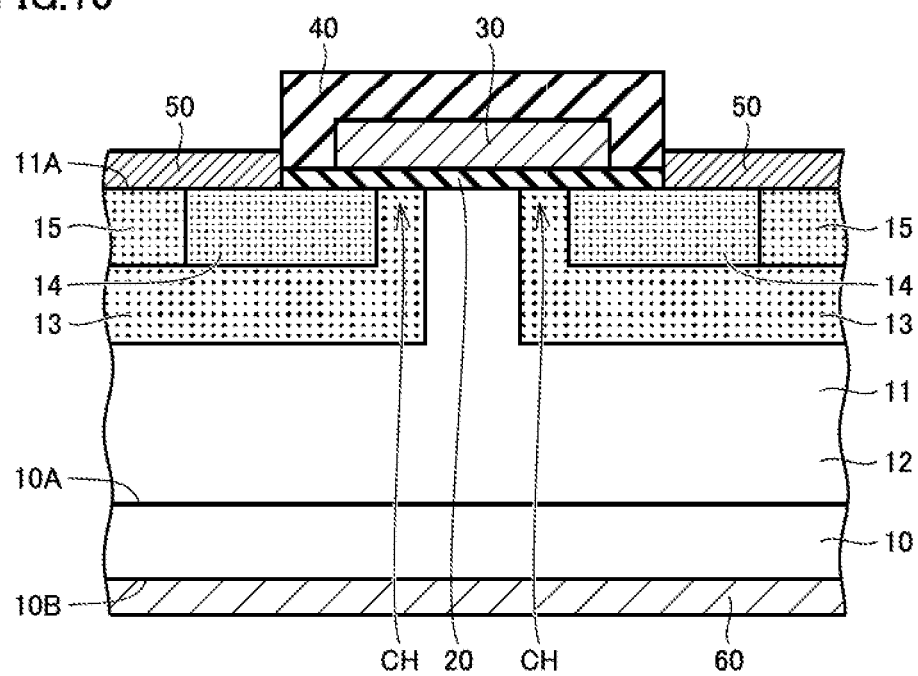
FIG. 10 is a schematic view for illustrating a step (S90) of the method for manufacturing the silicon carbide semiconductor device in accordance with Embodiment 1 of the present invention.

Next, as step (S90), an ohmic electrode forming step is performed. In this step (S90), referring to FIG. 10, first, gate insulating film 20 and lower layer interlayer insulating film 40 are removed by etching in regions in which source electrodes 50 are to be formed. Thereby, the regions in which source regions 14 and contact regions 15 are exposed are formed. Then, in each of these regions, a film made of, for example, Ni is formed. On the other hand, a film made of, for example, Ni is formed on main surface 10B of SiC substrate 10. Thereafter, by heating SiC substrate 10 at an annealing temperature of more than or equal to 1000° C., for example, at least portions of the films made of Ni are silicided. Thereby, source electrodes 50 and drain electrode 60 as ohmic electrodes are formed on main surface 11A of SiC layer 11 and main surface 10B of SiC substrate 10, respectively.

Figure 11:
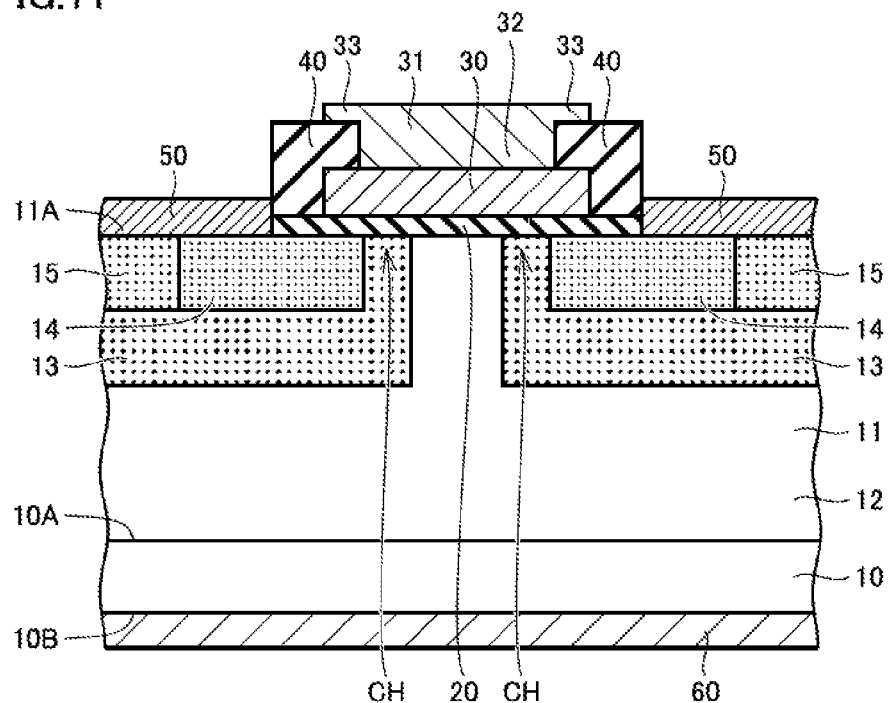
FIG. 11 is a schematic view for illustrating a step (S100) of the method for manufacturing the silicon carbide semiconductor device in accordance with Embodiment 1 of the present invention.

Next, as step (S100), a connection electrode forming step is performed. In this step (S100), referring to FIG. 11 first, a portion of lower layer interlayer insulating film 40 is removed by etching or the like to form a region (opening) in which a portion of gate electrode 30 is exposed. Next, a metal film is deposited in the region by an evaporation method or the like. Thereby, connection electrode 31 which has contact portion 32 having a width smaller than a width of gate electrode 30 and has electric resistance lower than electric resistance of gate electrode 30 is formed on gate electrode 30. More specifically, connection electrode 31 which has contact portion 32 in contact, with gate electrode 30 and wide portion 33 having a width larger than a width of contact portion 32, and in which wide portion 33 is located on lower layer interlayer insulating film 40 as shown in FIG. 11 is formed. In addition, after connection electrode 31 is formed, connection electrode 31 may be annealed at a temperature of less than or equal to 1000° C., (400° C., 300° C.).

Figure 12:
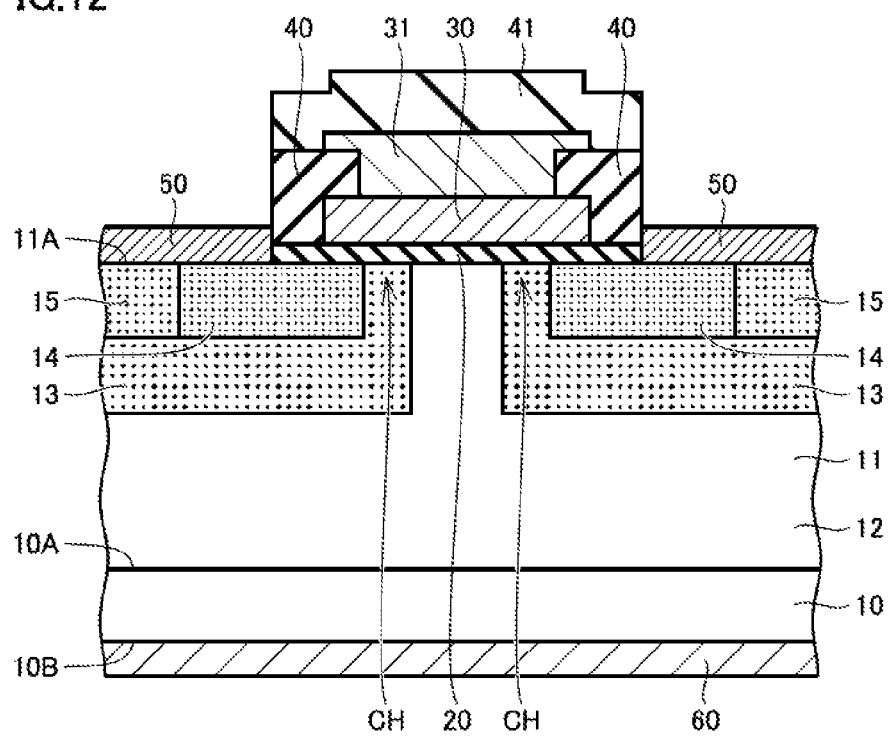
FIG. 12 is a schematic view for illustrating a step (S110) of the method for manufacturing the silicon carbide semiconductor device in accordance with Embodiment 1 of the present invention.

Next, as step (S110), an upper layer interlayer insulating film forming step is performed. In this step (S110), referring to FIG. 12, upper layer interlayer insulating film 41 made of $SiO_2$ is formed to cover connection electrode 31 and lower layer interlayer insulating film 40, for example by the CVD method. Thereby, gate electrode 30 and connection electrode 31 are surrounded by gate insulating film 20, lower layer interlayer insulating film 40, and upper layer interlayer insulating film 41, as shown in FIG. 12.

Next, as step (S120) a source wire forming step is performed. In this step (S120), referring to FIGS. 1 and 2, source wire 70 which is in contact with source electrodes 50 and made of a conductor such as Al is formed, for example by the evaporation method or the like.

Next, as step (S130), a gate pad electrode forming step is performed. In this step (S130), referring to FIGS. 1 and 3, gate pad electrode 80 which is in contact with connection electrode 31 and made of a conductor such as Al is formed, for example by the evaporation method or the like. By performing steps (S10) to (S130) described above in order, MOSFET 1 in accordance with the present embodiment is manufactured, and the method for manufacturing the silicon carbide semiconductor device in accordance with the present embodiment is completed.

Embodiment 2

Next, Embodiment 2 as another embodiment of the present invention will be described. A silicon carbide semiconductor device in accordance with Embodiment 2 basically has the same configuration and exhibits the same effect as those of the silicon carbide semiconductor device in accordance with Embodiment 1. Further, a method for manufacturing a silicon carbide semiconductor device in accordance with Embodiment 2 basically is performed through the same steps and exhibits the same effect as those of the method for manufacturing the silicon carbide semiconductor device in accordance with Embodiment 1. However, the silicon carbide semiconductor device and the method for manufacturing the same in accordance with Embodiment 2 are different float those in Embodiment 1 in the configuration of the connection electrode and the process for forming the same.

Figure 13:
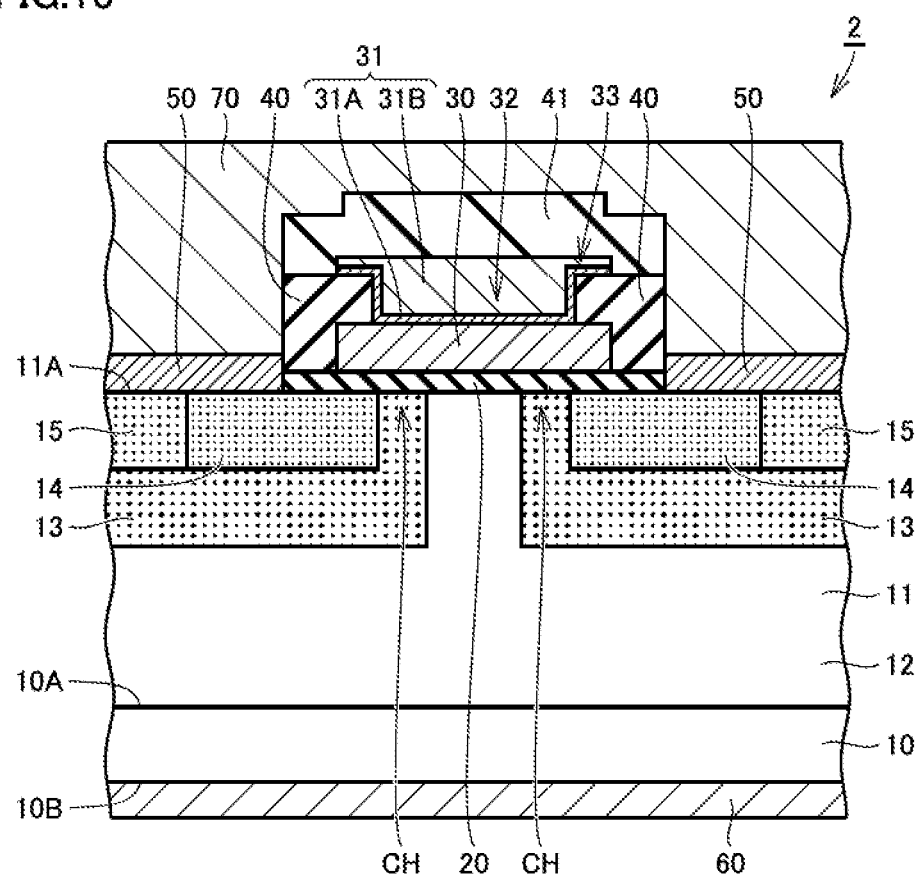
FIG. 13 is a schematic cross sectional view showing a structure of a silicon carbide semiconductor device in accordance with Embodiment 2 of the present invention.

First, a structure of a MOSFET 2 as a silicon carbide semiconductor device in accordance with Embodiment 2 will be described. Referring to FIG. 13, in MOSFET 2, connection electrode 31 includes barrier layer 31A in contact with lower layer interlayer insulating film 40, and an electrode layer 31B formed above gate electrode 30 and lower layer interlayer insulating film 40. Barrier layer 31A sandwiched between gate electrode 30 and lower layer interlayer insulating film 40, and electrode layer 31B. Barrier layer 31A is formed to extend from the upper surface of lower layer interlayer insulating film 40, along an inner wall of the opening in lower layer interlayer insulating film 40, to above gate electrode 30. Thereby, electrode layer 31B is isolated from lower layer interlayer insulating film 40 by barrier layer 31A, as shown in FIG. 13.

Barrier layer 31A contains a material having a low reactivity with lower layer interlayer insulating film 40, such as titanium nitride (TIN), for example, and is preferably made of TIN. Electrode layer 31B contains at least one metal selected from the group consisting of an aluminum alloy (including AlSi and AlSiCu), Al, Ti, TiN, Ni, Au, and Cu, for example, and is preferably made of one metal selected from the above group.

Next, a method for manufacturing the silicon carbide semiconductor device in accordance with Embodiment 2 will be described. Referring to FIG. 13, in the connection electrode forming step (S100) (FIG. 4) in Embodiment 2, first, barrier layer 31A which is made of a material such as TIN and which is on and in contact with lower layer interlayer insulating film 40 and gate electrode 30 is formed by the evaporation method or the like. Next, electrode layer 31B made of the metal material described above is formed on and in contact with barrier layer 31A. Thereafter, barrier layer 31A and electrode layer 31B are patterned using a photolithography method or the like. Thereby, connection electrode 31 which includes barrier layer 31A and electrode layer 31B, has contact portion 32 in contact with gate electrode 30 and wide portion 33 having a width larger than a width of contact portion 32, and in which wide portion 33 is located on lower layer interlayer insulating film 40 as shown in FIG. 13 is formed.

Embodiment 3

Next, Embodiment 3 as still another embodiment of the present invention will be described. A silicon carbide semiconductor device in accordance with Embodiment 3 basically has the same configuration and exhibits the same effect as those of the silicon carbide semiconductor device in accordance with Embodiment 2. Further, a method for manufacturing a silicon carbide semiconductor device in accordance with Embodiment 3 basically is performed through the same steps and exhibits the same effect as those of the method for manufacturing the silicon carbide semiconductor device in accordance with Embodiment 2. However, the silicon carbide semiconductor device and the method for manufacturing the same in accordance with Embodiment 3 are different from those in Embodiment 2 in the configuration of the connection electrode and the process for forming the same.

Figure 14:
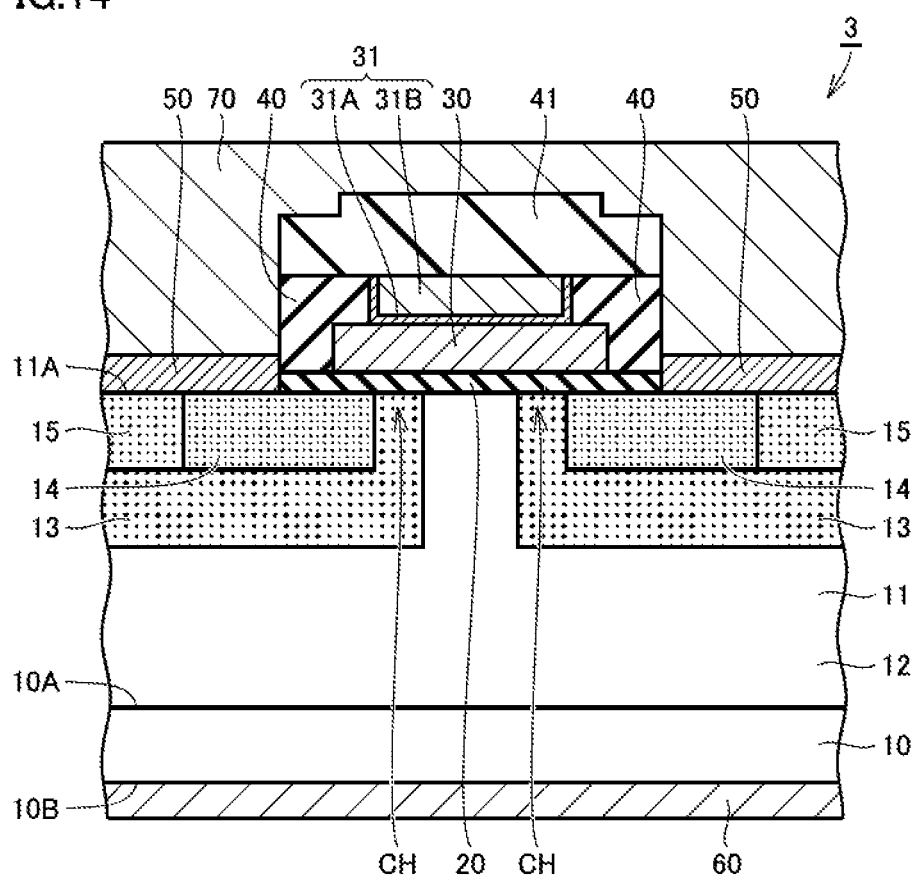
FIG. 14 is a schematic cross sectional view showing a structure of a silicon carbide semiconductor device in accordance with Embodiment 3 of the present invention.

Referring to FIG. 14, first, a structure of a MOSFET 3 as a silicon carbide semiconductor device in accordance with Embodiment 3 will be described. Referring to FIG. 14, in MOSFET 3, connection electrode 31 includes barrier layer 31A which is in contact with lower layer interlayer insulating film 40 and made of TiN, and electrode layer 31B formed above gate electrode 30. Barrier layer 31A is sandwiched between gate electrode 30 and electrode layer 3B. Barrier layer 31A is formed to extend from a side wall surface of the opening in lower layer interlayer insulation film 40 to above gate electrode 30. Thereby, electrode layer 31B is isolated from lower layer interlayer insulating film 40 by barrier layer 31A, as shown in FIG. 14. Here, MOSFET 3 in accordance with Embodiment 3 is different in structure from MOSFET 2 in that connection electrode 31 does not have a wide portion located on lower layer interlayer insulating film 40. That is, MOSFET 3 is configured such that, in a cross sectional view along the thickness direction shown in FIG. 14, the upper surface of connection electrode 31 (including barrier layer 31A and electrode layer 31B) and the upper surface of lower layer interlayer insulating film 40 constitute one continuous plane, and the lower surface of upper layer interlayer insulating film 41 is in contact with the plane.

Next, a method for manufacturing the silicon carbide semiconductor device in accordance with Embodiment 3 will be described. Referring to FIG. 14, in the connection electrode forming step (S100) (FIG. 4) in Embodiment 3, first, barrier layer 31A which is made of a material such as TiN and which is on and in contact with the side wall surface of the opening in lower layer interlayer insulating film 40 and gate electrode 30 is formed by the evaporation method or the like. Next, electrode layer 31B is formed on and in contact with barrier layer 31A. Thereafter, portions of barrier layer 31A and electrode layer 31B located on the upper surface of lower layer interlayer insulating film 40 are removed by etch back, CMP (Chemical Mechanical Polishing), or the like. Thereby, connection electrode 31 is formed to include barrier layer 31A and electrode layer 31B, not to have a wide portion, and to fill the opening in lower layer interlayer insulating film 40, as shown in FIG. 14.

It is noted that, although each of Embodiments 1 to 3 has described a planar type MOSFET as exemplary silicon carbide semiconductor device and method for manufacturing the same, the present invention is also applicable to a trench type MOSFET. Further, the present invention is not limited to a MOSFET, and is also applicable to an IGBT (Insulated Gate Bipolar Transistor).

Although the embodiments of the present invention have been described above, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A silicon carbide semiconductor device, comprising:
a silicon carbide layer including one main surface and another main surface opposite to said one main surface, said silicon carbide layer including
a drift region which includes said another main surface and has a first conductivity type,
a body region which is formed on said drift region and has a second conductivity type, and
a source region which includes said one main surface, is formed to sandwich said body region between said source region and said drift region, and has the first conductivity type;
a gate insulating film located on a channel region which is sandwiched between said drift region and said source region in said body region, said channel region including said one main surface;
a gate electrode formed above said channel region, said gate insulating film being sandwiched between said gate electrode and said channel region;
a connection electrode which includes a portion having a width smaller than a width of said gate electrode, has electric resistance lower than electric resistance of said gate electrode, and is formed on said gate electrode; and
a gate pad electrode formed laterally away from said channel region and directly connected to the connection electrode.

2. The silicon carbide semiconductor device according to claim 1, further comprising an interlayer insulating film formed on said gate insulating film, wherein
said connection electrode includes
a contact portion in contact with said gate electrode, and
a wide portion which has a width larger than a width of said contact portion and is located on said interlayer insulating film.

3. The silicon carbide semiconductor device according to claim 2, wherein said connection electrode includes a barrier layer in contact with said interlayer insulating film.

4. The silicon carbide semiconductor device according to claim 1, further comprising an interlayer insulating film formed on said gate insulating film, wherein
said connection electrode includes a barrier layer in contact with said interlayer insulating film.

5. The silicon carbide semiconductor device according to claim 3, wherein said barrier layer contains titanium nitride.

6. The silicon carbide semiconductor device according to claim 1, wherein said gate electrode contains polysilicon having p type conductivity.

7. The silicon carbide semiconductor device according to claim 1, wherein said connection electrode contains at least one metal selected from the group consisting of an aluminum alloy, aluminum, titanium, titanium nitride, tungsten, molybdenum, nickel, gold, and copper.

8. The silicon carbide semiconductor device according to claim 7, wherein said aluminum alloy contains silicon as an alloy element, or contains silicon and copper as alloy elements.

9. The silicon carbide semiconductor device according to claim 1, wherein
said silicon carbide semiconductor device has a peripheral shape of a quadrangle in which at least one side has a length of more than or equal to 2 mm when said one main surface of said silicon carbide layer is viewed in a plan view.

10. The silicon carbide semiconductor device according to claim 9, wherein a ratio of a maximum width to a minimum width of said gate pad electrode is more than or equal to 2 and less than or equal to 3.

* * * * *